(12) United States Patent
Murugan

(10) Patent No.: US 7,169,345 B2
(45) Date of Patent: Jan. 30, 2007

(54) METHOD FOR INTEGRATED CIRCUIT PACKAGING

(75) Inventor: Selvarajan Murugan, Kuala Lumpur (MY)

(73) Assignee: Texas Instruments Incorporated, Dallas, TX (US)

( * ) Notice: Subject to any disclaimer, the term of this patent is extended or adjusted under 35 U.S.C. 154(b) by 418 days.

(21) Appl. No.: 10/648,964

(22) Filed: Aug. 27, 2003

(65) Prior Publication Data
US 2005/0046079 A1 Mar. 3, 2005

(51) Int. Cl.
*B29C 45/14* (2006.01)
(52) U.S. Cl. .......................... 264/272.15; 264/272.17; 264/328.4; 425/116; 425/544
(58) Field of Classification Search .......... 264/272.11, 264/272.15, 272.17, 276, 328.4, 328.5, 338; 425/116, 544; 438/118, 126
See application file for complete search history.

(56) References Cited

U.S. PATENT DOCUMENTS

| | | | | |
|---|---|---|---|---|
| 5,542,171 A | * | 8/1996 | Juskey et al. ................. 29/840 |
| 5,635,671 A | * | 6/1997 | Freyman et al. ........... 174/52.2 |
| 5,656,549 A | * | 8/1997 | Woosley et al. ............ 438/118 |
| 5,723,156 A | * | 3/1998 | Matumoto ................... 425/116 |
| 5,800,747 A | * | 9/1998 | Cavasin ........................ 264/39 |
| 5,846,477 A | * | 12/1998 | Hotta et al. ................. 264/511 |
| 5,961,912 A | * | 10/1999 | Huang et al. ........... 264/272.15 |
| 6,096,250 A | * | 8/2000 | Chen ........................... 264/130 |
| 6,309,914 B1 | * | 10/2001 | Huang et al. ................ 438/124 |
| 6,372,553 B1 | * | 4/2002 | Briar ........................... 438/127 |
| 6,432,751 B1 | * | 8/2002 | Haji ............................ 438/124 |
| 6,545,368 B2 | * | 4/2003 | Wensel ........................ 257/787 |
| 2003/0062605 A1 | * | 4/2003 | Yoshike ....................... 257/666 |

* cited by examiner

*Primary Examiner*—Edmund H. Lee
(74) *Attorney, Agent, or Firm*—Yingsheng Tung; Wade James Brady, III; Frederick J. Telecky, Jr.

(57) ABSTRACT

According to one embodiment of the invention, a system for packaging integrated circuits includes a mold tool for packaging integrated circuits. The mold tool includes a first mold plate that includes a first non-planar surface and a second mold plate that includes a second non-planar surface. The first and second non-planar surfaces form upper and lower surfaces of a mold cavity when the first and second mold plates are engaged. The mold tool also includes a distribution system coupled to the mold cavity. The distribution system transfers a mold compound into the mold cavity to substantially encapsulate an integrated circuit. The distribution system includes a gate runner coupled to the mold cavity. The gate runner funnels the mold compound into the mold cavity. The distribution system also includes a bridge insert that decreases wear on the gate runner as the mold compound is transferred through the gate runner.

3 Claims, 3 Drawing Sheets

METHOD FOR INTEGRATED CIRCUIT PACKAGING

TECHNICAL FIELD OF THE INVENTION

This invention relates generally to the field of integrated circuit packaging and, more specifically, to an improved method and system for integrated circuit packaging.

BACKGROUND OF THE INVENTION

The packaging of integrated circuits includes encapsulating semiconductor chips and their associated components within a molding. A mold press compresses two mold plates to encapsulate an integrated circuit within a cavity of the mold. A mold compound is transferred through a distribution system to the mold cavity to allow the mold compound to partially or completely surround the integrated circuit. Distribution systems for transferring the mold compound typically comprise a gate runner, which operates to funnel the mold compound into the mold cavity. Because the mold compound usually includes an abrasive, high temperature epoxy resin, the mold compound results in the gradual deterioration or wearing out of the bridge between the gate runner and the mold cavity. Accordingly, mold tools are periodically removed from the production line for the restoration of the gate runner profile and other components of the distribution system.

SUMMARY OF THE INVENTION

According to one embodiment of the invention, a system for packaging integrated circuits includes a mold tool for packaging integrated circuits. The mold tool includes a first mold plate that includes a first non-planar surface and a second mold plate that includes a second non-planar surface. The first and second non-planar surfaces form upper and lower surfaces of a mold cavity when the first and second mold plates are engaged. The mold tool also includes a distribution system coupled to the mold cavity. The distribution system transfers a mold compound into the mold cavity to substantially encapsulate an integrated circuit. The distribution system includes a gate runner coupled to the mold cavity. The gate runner funnels the mold compound into the mold cavity. The distribution system also includes a bridge insert that decreases wear on the profile of the gate runner as the mold compound is transferred through the gate runner.

Some embodiments of the invention provide numerous technical advantages. Other embodiments may realize some, none, or all of these advantages. For example, because mold fillers in the mold compound are abrasive, the high temperature mold compound wears the surface of the gate causing deterioration of the bridge from the distribution system to the mold chase. A bridge insert comprised of advanced ceramics and characterized superior strength and toughness qualities, fine grain size, and little or no porosity decreases the deterioration of the gate runner. Accordingly, a ceramic bridge insert increases the number of cycles in which a mold tool can be used before being dismantled for restoration or refurbishing. For example, a ceramic bridge insert may increase the lifespan of the mold tool to approximately 1 kk mold cycles.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1 through 4 of the drawings, in which like numerals refer to like parts.

In order to package integrated circuit devices such as processors, memories, logic units, and the like that might comprise field effect transistors and other semiconductor structures, the integrated circuit devices are placed in a mold tool that operates to encapsulate each integrated circuit device in a set mold compound. The mold tool includes a mold chase, which includes a distribution system coupled to one or more mold cavities containing integrated circuit devices. The distribution system typically disperses a liquid mold compound through a runner system, which funnels the mold compound through one or more passages and a gate runner before transferring the mold compound into the mold cavity. The abrasive, high temperature mold compound results in the gradual deterioration of the gate runner at the point of the connection between the gate runner and the mold cavity. According to various embodiments of the present invention, the mold compound is funneled through a ceramic bridge insert that overlays a portion of the inner surface of the gate runner. The ceramic bridge insert decreases the gradual deterioration of the gate runner of the mold tool.

Figure 1:
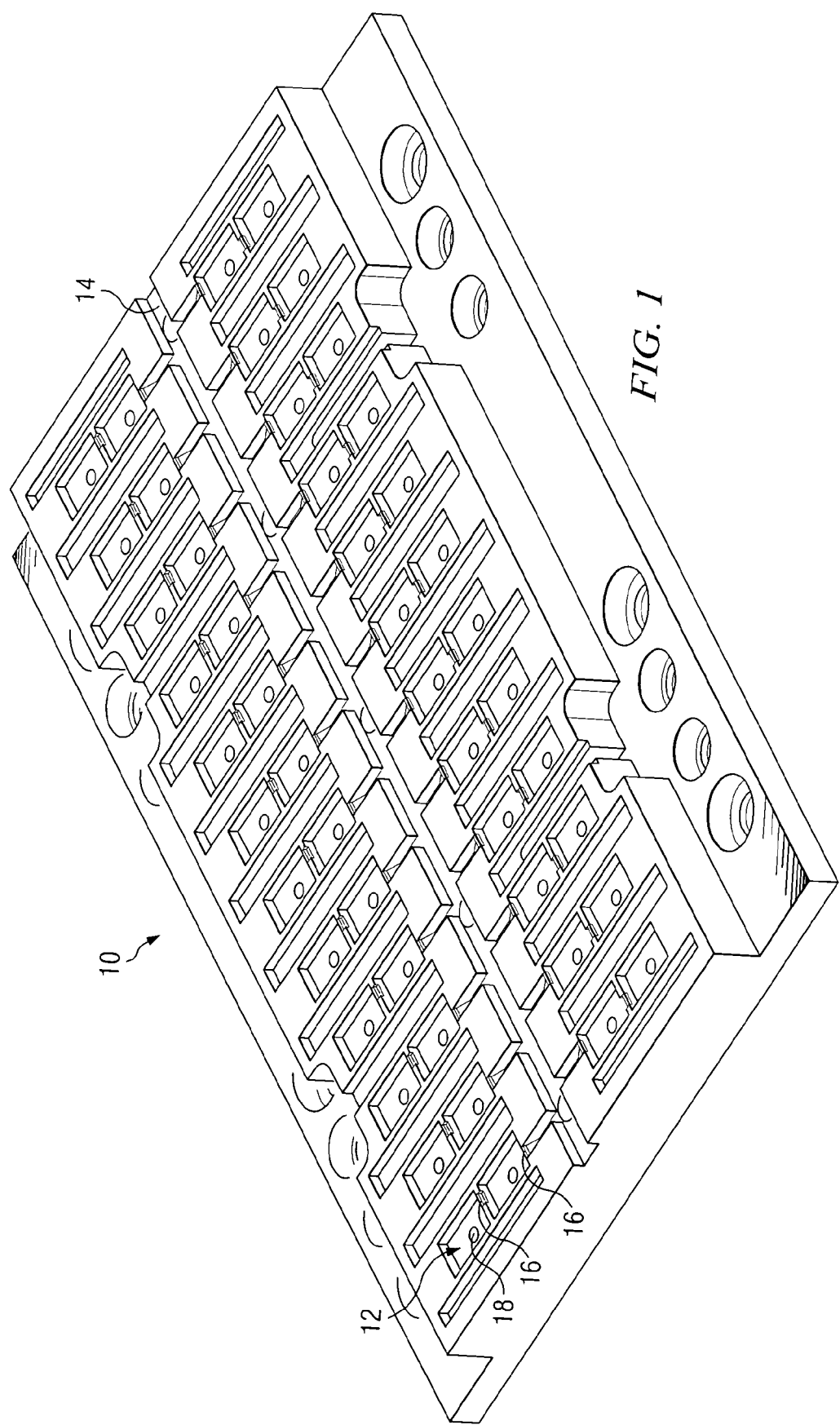
FIG. 1 illustrates an example mold tool for the packaging of integrated circuits in accordance with an embodiment of the invention.

FIG. 1 illustrates a mold chase system 10 for the packaging of integrated circuits in accordance with an embodiment of the invention. The mold chase system 10 includes two or more mold chases 12, a distribution system 14, and one or more gate runners 16 coupling the distribution system 14 to the mold chases 12. Each mold chase 12, distribution system 14, and gate runner 16 of the mold chase system 10 operate cooperatively to disperse mold compound through the system 10 to encapsulate one or more integrated circuits disposed in the mold chase system 10 in a mold.

Figure 2:
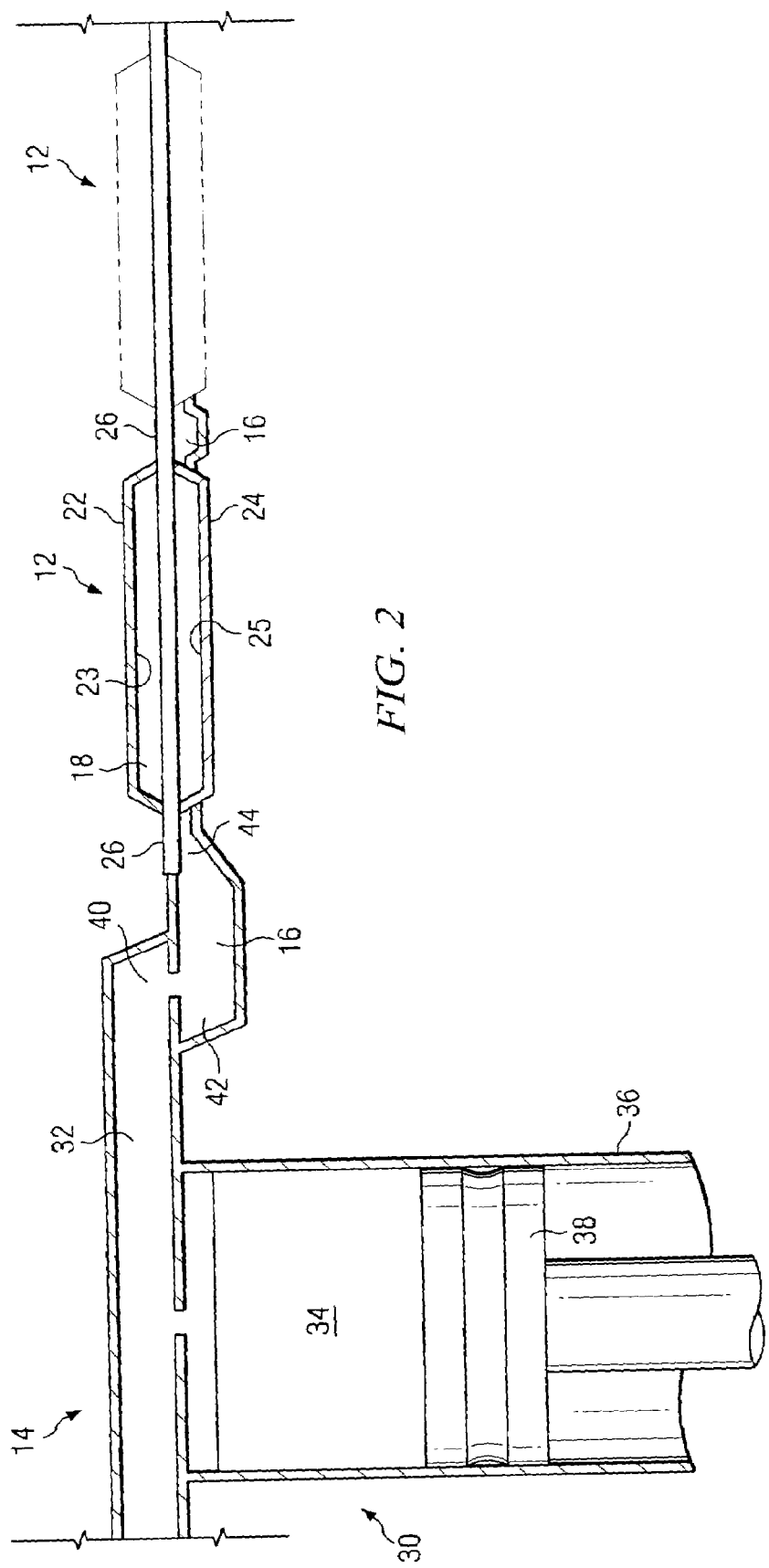
FIG. 2 illustrates an example distribution system for the packaging of integrated circuits in accordance with an embodiment of the invention.
Figure 3:
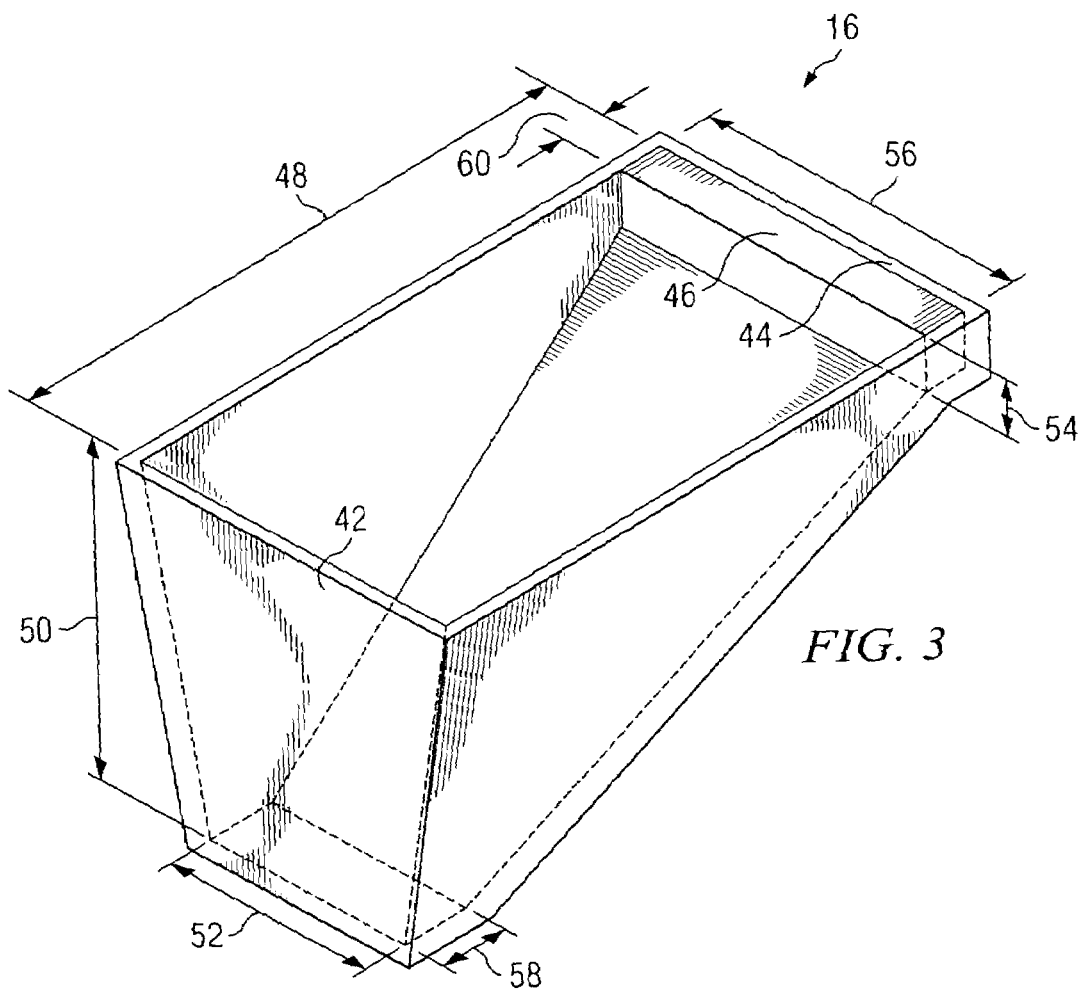
FIG. 3 illustrates an example gate runner with a ceramic bridge insert in accordance with an embodiment of the invention.

A mold chase 12 is formed when first and second mold plates are assembled to form a mold cavity 18. The first and second mold plates are illustrated in FIG. 2 and will be described in greater detail below. The first and second mold plates may be clamped together such that each mold chase 12 is compressed to form a seal surrounding a corresponding mold cavity 18. The mold chase 12 and first and second mold plates may be of any appropriate material. Each mold chase 12 is coupled to a distribution system 14. The distribution system 14 includes one or more passages and aids in the transfer of mold compound from a compound source to one or more of the mold cavities 18. The distribution system 14 also includes a gate runner 16 forming the transition from the passages and the mold cavities 18. The gate runner 16 acts as a nozzle for the disbursement of mold compound and controls the pressure drop inside the mold cavities 18 as the mold compound is transferred from the distribution system 14 to the mold cavity 18. The distribution system 14 and the gate runner 16 are illustrated in FIGS. 2 and 3, respectively, and will be described in greater detail below.

In operation, the first and second mold plates are assembled and clamped together to form a mold cavity 18. Each mold cavity 18 encapsulates an integrated circuit and its corresponding components. Mold compound is transferred from a mold compound source through the distribution system 14. The gate runner 16 of the distribution system 14 couples to a corresponding mold cavity 18. Mold compound is transferred into the mold cavity 18 through the gate runner 16 and is allowed to cure to form a package surrounding the integrated circuit. After curing, the mold plates forming the mold chases 12 are disassembled from one another. The cured mold compound forms a package around the integrated circuits, which protects the packaged integrated circuit from moisture, dust, and pollutants during subsequent fabrication processes.

FIG. 2 illustrates an example distribution system 14 for the packaging of integrated circuits within a mold chase 12 in accordance with an embodiment of the invention. As described above, the mold chase 12 includes a first mold plate 22 and a second mold plate 24. The first mold plate 22 includes a first non-planar surface 23. The second mold plate 24 includes a second non-planar surface 25. The first and second mold plates 22 and 24 are clamped together such that the mold chase 12 is compressed to form a seal surrounding a corresponding mold cavity 18. The first non-planar surface 23 and second non-planar surfaces form upper and lower surfaces of a mold cavity 18 when first and second mold plates 22 and 24 are engaged. The mold chase 12 may also include a lead frame 26. The lead frame 26 may be loaded between the first mold plate 22 and the second mold plate 24. When first mold plate 22 and second mold plate 24 are assembled together, the mold cavity 18 is formed around a portion of the lead frame 26 and a semiconductor device. In particular embodiments, the lead frame 26 may operate to couple two or more mold chases 12. A second gate runner 16 may also couple the two mold chases 12. Accordingly, a single lead frame 26 may link distribution system 14 to multiple mold chases 12, and each mold chase 12 may store a semiconductor device for the molding process. The mold chase 12 is coupled to the distribution system 14 to receive mold compound 34. The high temperature mold compound 34 is transferred under high pressure through the distribution system 14. In particular embodiments, the surface of the mold chase 12 is on the order of 175° Celsius. The mold compound 34, which will be described in further detail below, flows under the application of heat and pressure. As the mold compound 34 passes through the gate runner 16, the velocity of the mold compound 34 increases and the compound is forced inside the first cavity. Where the lead frame 26 couples two or more chases 12 separated by gate runners 16, the mold compound is also forced inside the second gate runner 16 and the additional mold chase 12.

The distribution system 14 includes a mold compound source system 30, one or more passages 32, and a gate runner 16. The passages 32, mold compound source system 30, and gate runner 16 operate cooperatively to transfer mold compound 34 through the distribution system 14 for the encapsulation of integrated circuits in the mold chase 12. The mold compound source system 30 includes a mold compound source 36 for storing mold compound 34 before the mold compound 34 is distributed to the mold cavity 18. The mold compound 34 may be any suitable type of plastic or polymer, such as thermosets or thermoplastics. The mold compound 34 may include a thermoset comprised of an epoxy resin and fillers and may be heated to a temperature on the order of 170 to 175° C. while in the distribution system 14. Mold compound fillers may include alumina, magnesium oxide, silicon nitride, or a combination thereof. Mold compound fillers lower the coefficient of thermal expansion and improves the thermal conductivity and mechanical properties of the mold compound 34. Prior to the distribution of the mold compound 34, mold compound 34 is typically in the form of powder, granules, or cold compacted powder pellets or preforms, or a low viscosity liquid.

Mold compound source 36 may be formed in any shape or size suitable for molding applications. Mold compound source system 30 also includes a plunger 38 or other compression tool. The size and shape of the plunger 38 typically corresponds to the size and shape of the mold compound source 36. Accordingly, where mold compound source 36 is substantially cylindrical, the plunger 38 may also be substantially cylindrical and be shaped to fit snugly inside mold compound source 36. Plunger 38 may be used in conjunction with mold compound source 36 to apply a compressive load to mold compound 34 in mold compound source 36. The compressive load may operate to transfer mold compound 34 from mold compound source 36 and through distribution system 14.

Distribution system 14 also includes one or more passages 32 coupled to mold compound source system 30. The passages 32 may include cylindrically shaped tubes or pipes or any other conduit suitable for transporting mold compound 34 from mold compound source 36. The one or more passages 32 are adapted to couple the mold compound source 36 with the gate runner 16. Accordingly, a distal end 40 of one of the passages 32 is coupled to a first end 42 of the gate runner 16. A second end 44 of the gate runner 16 forms a transition from distribution system 14 to mold chase 12. The flow of the mold compound 34 through the gate runner 16 has an influence on the temperature and viscosity of the mold compound 34 as it contacts the lead frame 26 and the integrated circuit. Although the gate runner 16 may be of any shape or size suitable for transitioning the distribution system 14 to mold chase 12, the size and shape of the gate runner 16 may be machined such that the gate runner 16 controls the pressure drop inside the mold cavity 18. Because the mold compound 34 is heated significantly as the mold compound 34 flows from the gate runner 16 to the mold cavity 18, the temperature rise also influences the viscosity of the mold compound 34. In turn, the viscosity of the mold compound 34 influences quality parameters of the molding process such as short fills, wire sweep, and gate remains.

The gate runner 16 may be comprised of steel and/or carbide or any other material suitable for molding processes. Because the mold fillers in the mold compound 34 are very abrasive, the mold fillers wear the surface of the second end 44 of the gate runner 16 causing deterioration of the transition from distribution system 14 to mold chase 12. The passage of the mold compound 34 typically deteriorates the profile of the gate runner 16 in proportion to the number of times, or cycles, that the mold chase system 10 is used to form a mold around one or more integrated circuit devices. As the profile of the gate runner 16 is deteriorated, the quality problems associated with the gate runner 16 increases. Thus, as the second end 44 of the gate runner 16 wears out, the instances of wire sweep, short fills, and gate remains increases. The gate runner 16 is depicted in greater detail in FIG. 3 and will be further described below.

FIG. 3 illustrates an example gate runner 16 with a bridge insert 46 in accordance with an embodiment of the invention. As described above, gate runner 16 includes first end 42 and second end 44 and operates to transfer mold compound 34 from distribution system 14 to mold cavity 18. In particular embodiments, the cross-sectional area of the second end 44 of the gate runner 16 may be less than the cross-sectional area of the first end 42 of the gate runner 16. For example, where the gate runner 16 has an overall length 48 on the order of 0.105 inches, the first end 42 of the gate runner 16 may have a first end height 50 on the order of 0.059 inches and a first end width 52 on the order of 0.038 inches. Because the height of the second end 44 is smaller the second end 44 operates to funnel the mold compound 34 from the gate runner 16 into the mold cavity 18, the second end 44 of the gate runner 16 may have a second end height 54 on the order of 0.010 inches and a second end width 56 on the order of 0.060 inches. In this example embodiment, the cross-sectional area of the gate runner 16 may begin to gradually decrease at a length 58 on the order of 0.012 inches from first end 42. Although gate runner 16 is illustrated as having substantially planar surfaces, gate runner 16 may be of any shape or size suitable for transitioning the distribution system 14 to mold chase 12. Thus, while the gate runner 16 is illustrated as a modified box, the gate runner 16 may be conical or any other shape that operates to funnel the mold compound 34.

In accordance with particular embodiments, the second end 44 of the gate runner 16 includes a bridge insert 46. Bridge insert 46 is of a size and shape that corresponds to the size and shape the second end 44 of the gate runner 16. For example, where the second end 44 of the gate runner 16 has the dimensions described above, the bridge insert may also have a corresponding height 54 on the order of 0.010 inches and a corresponding width 56 on the order of 0.060 inches. In such an embodiment, the bridge length 60 may be on the order of 0.008 inches. Bridge insert 46 overlays the inner wall of the second end 44 of the gate runner 16. The bridge insert 46 may be made of a ceramic material and fitted to the cavity by a precisely machined pocket. The gate profile in the bridge insert is machined by special electric discharge machining processes.

In certain embodiments, bridge insert 46 is fabricated of an advanced ceramic having hardness and wear resistance qualities that are superior to conventional steel and/or carbide. Advanced ceramics are metal composites manufactured by sophisticated sintering technology and include electrically conductive oxides and nitrides to permit electrical discharge machining. For example, bridge insert 46 may be composed of a silicon nitride doped with 50% titanium nitride. Unlike traditional ceramics that are brittle and porous, electrically conductive advanced ceramics are characterized by superior strength and toughness, fine grain size, and little or no porosity. Accordingly, the bridge insert 46 composed of an advanced ceramic decreases the deterioration of the gate runner 16 and increases the number of cycles in which a mold chase system 10 can be used before the gate runner 16 must be refurbished or restored. For example, bridge insert 46 may increase the lifespan of the mold tool to approximately 1 kk mold cycles.

Figure 4:
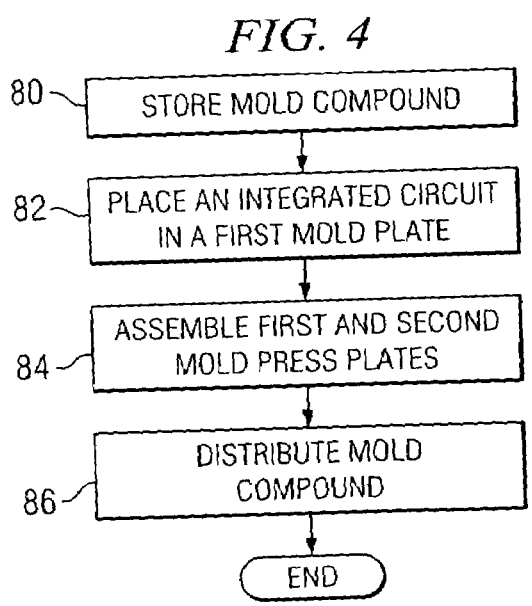
FIG. 4 illustrates an example method for packaging integrated circuits in accordance with an embodiment of the invention.

FIG. 4 illustrates an exemplary method for packaging integrated circuits in accordance with an embodiment of the invention. In step 80, a mold compound is stored. The mold compound may be stored in the mold chase system 10. In particular embodiments, the mold compound may be stored in the mold compound source 36 of the distribution system 14. An integrated circuit may then be placed in a first mold plate 22 of the mold chase 12 in step 82. The integrated circuit may be placed in the first mold plate 22 robotically or by any other method used in molding processes.

In step 84, the first mold plate 22 and the second mold plate 24 of the mold chase 12 are assembled. The mold plates 22 and 24 may be assembled by engaging a first non-planar surface 23 of the first mold plate 22 with a second non-planar surface 25 of the second mold plate 24. For example, the first and second non-planar surfaces 23 and 25 may be clamped together. The assembly of first and second mold plates 22 and 24 encapsulates the integrated circuit in the mold cavity 18 and forms a seal around the integrated circuit.

In step 86, the mold compound 34 is distributed through the mold chase system 10. Distributing the mold compound 34 may include transferring the mold compound 34 through a distribution system 14 coupled to the mold cavity 18. As discussed above, the distribution system 14 may include a gate runner 16, one or more passages 32 and a mold compound source system 30. Accordingly, distributing the mold compound 34 may include transferring the mold compound from the mold compound source system 30, through the one or more passages 32, and into the gate runner 16, which then funnels the mold compound 34 into the mold cavity 18. For example, where the mold compound source system 30 includes mold compound source 36 and plunger 38, distributing the mold compound 34 may further include applying a compressive load to the mold compound 34 in mold compound source 36 using the plunger 38. The compressive load may force the mold compound 34 from the mold compound source 36 and into the one or more passages 32 where the mold compound 34 travels to the gate runner 16. The mold compound 34 is transferred through the first and second ends 42 and 44 of the gate runner 16 before it is distributed into the mold cavity 18. In particular embodiments, the cross-sectional area of the second end 44 of the gate runner 16 is less than the cross-sectional area of the first end 42 and operates to funnel the mold compound 34 into the mold cavity 18. A bridge insert 46 overlays the interior wall of the second end 44 of the gate runner 16. The bridge insert 46 may be of a size and shape that corresponds to the second end 44 of the gate runner 16. The bridge insert 46 may be fabricated of an advanced ceramic having hardness and wear resistance qualities that are superior to the materials comprising the gate runner 16. Accordingly, a bridge insert 46 comprised of advanced ceramics and characterized by superior strength and toughness qualities may increase the number of cycles in which a mold chase system 10 can be used before being dismantled for refurbishing or restoration.

Although embodiments of the invention and their advantages are described in detail, a person skilled in the art could make various alterations, additions, and omissions without departing from the spirit and scope of the present invention, as defined by the appended claims.

What is claimed is:

1. A method of packaging integrated circuits, comprising:
providing a first mold plate comprising a first non-planar surface;
providing a second mold plate comprising a second non-planar surface, the first and second non-planar surfaces forming upper and lower surfaces of a mold cavity when the first and second mold plates are engaged;

transferring a mold compound through a distribution system coupled to the mold cavity to substantially encapsulate an integrated circuit, the distribution system comprising a gate runner coupled to the mold cavity, the gate runner operable to funnel the mold compound into the mold cavity, the gate runner including a bridge insert operable to decrease wear on the gate runner as the mold compound is transferred through the gate runner; the bridge insert comprising a ceramic bridge insert, the ceramic bridge insert including a metal oxide composite.

2. A method of packaging integrated circuits, comprising:

providing a first mold plate comprising a first non-planar surface;

providing a second mold plate comprising a second non-planar surface, the first and second non-planar surfaces forming upper and lower surfaces of a mold cavity when the first and second mold plates are engaged;

transferring a mold compound through a distribution system coupled to the mold cavity to substantially encapsulate an integrated circuit, the distribution system comprising a gate runner coupled to the mold cavity, the gate runner operable to funnel the mold compound into the mold cavity, the gate runner including a bridge insert operable to decrease wear on the gate runner as the mold compound is transferred through the gate runner; the bridge insert comprising a ceramic bridge insert, the ceramic bridge insert including a metal nitride composite.

3. A method of packaging integrated circuits, comprising:

providing a first mold plate comprising a first non-planar surface;

providing a second mold plate comprising a second non-planar surface, the first and second non-planar surfaces forming upper and lower surfaces of a mold cavity when the first and second mold plates are engaged;

transferring a mold compound through a distribution system coupled to the mold cavity to substantially encapsulate an integrated circuit, the distribution system comprising a gate runner coupled to the mold cavity, the gate runner operable to funnel the mold compound into the mold cavity, the gate runner including a bridge insert operable to decrease wear on the gate runner as the mold compound is transferred through the gate runner; the bridge insert comprising a ceramic bridge insert, the ceramic bridge insert including silicon nitride doped with titanium nitride.

* * * * *